United States Patent [19]

Kuo

[11] Patent Number: 4,629,997
[45] Date of Patent: Dec. 16, 1986

[54] AMPLIFIER ACTIVE LOAD

[75] Inventor: James R. Kuo, Cupertino, Calif.

[73] Assignee: Fairchild Semiconductor Corporation, Cupertino, Calif.

[21] Appl. No.: 715,848

[22] Filed: Mar. 25, 1985

[51] Int. Cl.$^4$ ................................................ H03F 3/45
[52] U.S. Cl. .................................... 330/257; 330/260
[58] Field of Search ............... 330/257, 260, 288, 301; 323/315, 316

[56] References Cited

U.S. PATENT DOCUMENTS 3,916,331 10/1975 Schenck ......................... 330/257 X Primary Examiner—James B. Mullins
Attorney, Agent, or Firm—Carl L. Silverman; Stephen J. Phillips; Paul C. Haughey

[57] ABSTRACT

The present invention is an improved active load which eliminates the current imbalance between the collectors of the emitter-coupled input transistors. The circuit includes a pair of first and second emitter-coupled transistors with their collectors coupled to a current source which supplies substantially equal currents to the collectors of the two transistors. The collector of one of the emitter-coupled transistors is coupled to the base of a third output transistor. A fourth transistor is coupled between the collector of the output transistor and the supply voltage. Finally, the circuit includes means for supplying the base current to the fourth transistor such that the base current of the fourth transistor and the third output transistor are substantially equal and the collector currents of the first and second emitter-coupled transistors remain substantially equal, resulting in negligible offset current and high open loop gain. Preferably, this is done by coupling the base of the fourth transistor to the collector of the first emitter-coupled transistor while the base of the output transistor is coupled to the collector of the second emitter-coupled transistor.

8 Claims, 6 Drawing Figures

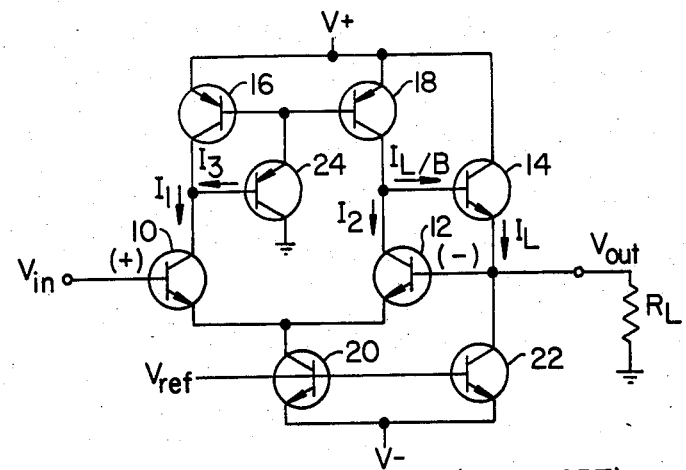
FIG._1. (PRIOR ART)
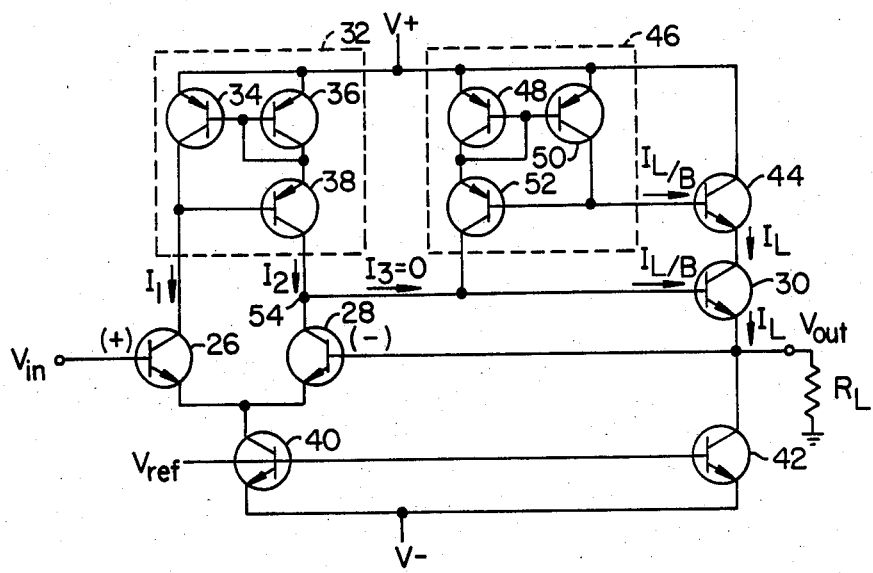
FIG._2.
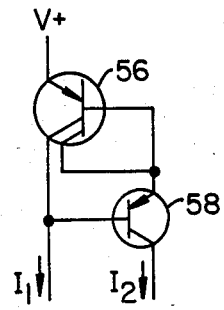
FIG._2A.

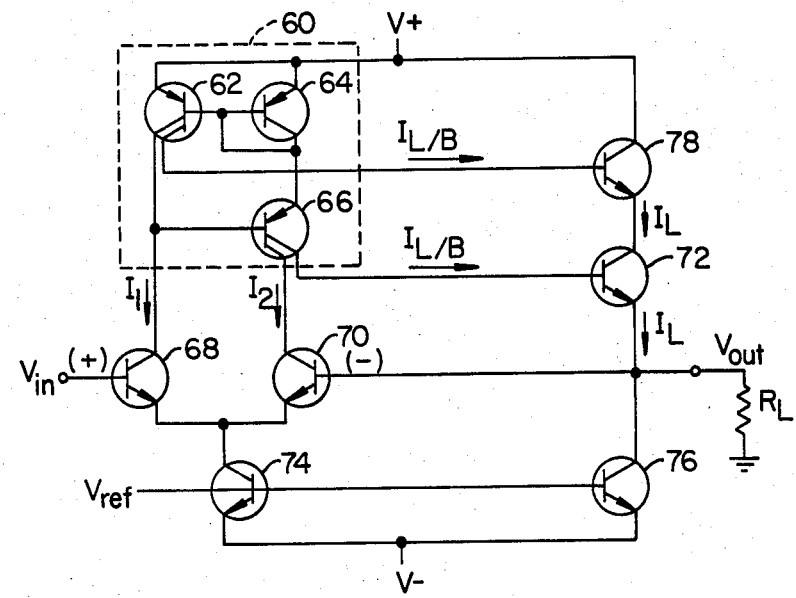
FIG._3.
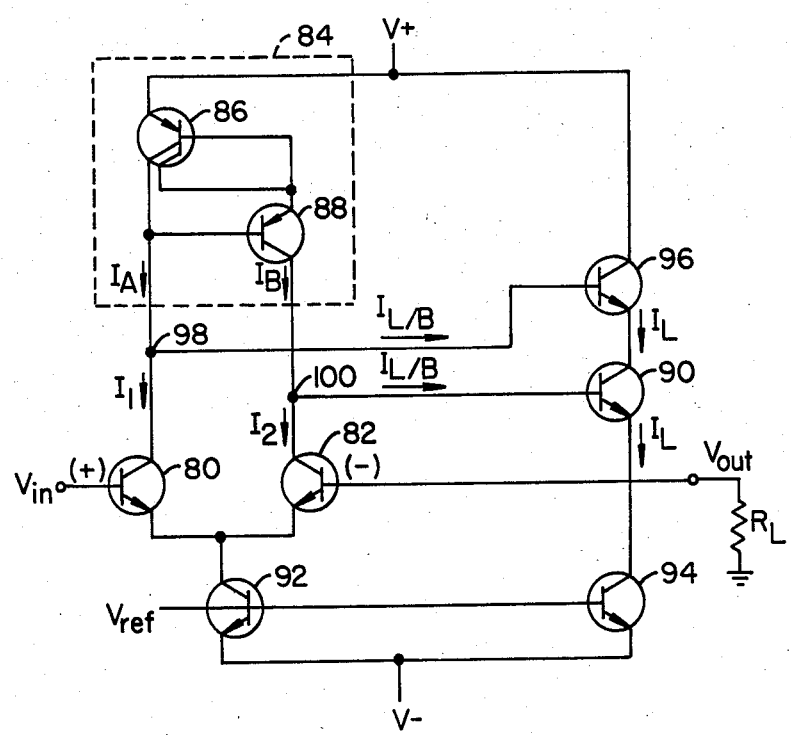
FIG._4.

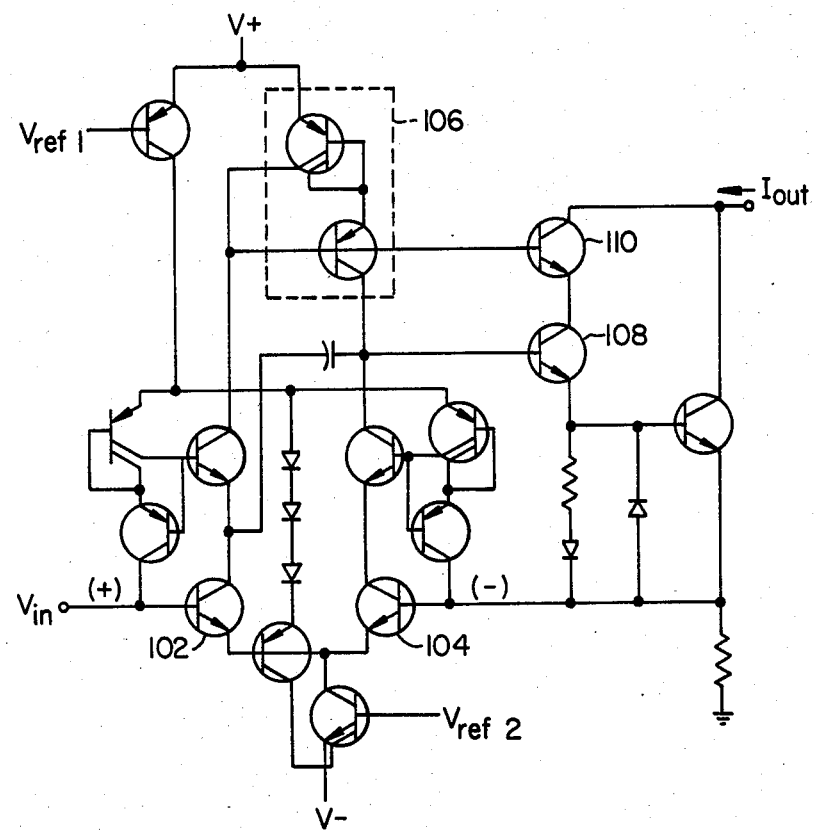
FIG._5.

4,629,997

AMPLIFIER ACTIVE LOAD

BACKGROUND OF THE INVENTION

This invention relates to an improved active load for a buffer amplifier.

In a basic prior art amplifier design, for example as illustrated in FIG. 1, a pair of emitter-coupled transistors provide non-inverting and inverting inputs. The collectors of the emitter-coupled transistors are each coupled to a current source and one of the collectors is coupled to the base of an output transistor which is coupled to the output load. The current source and the output transistor are considered the active load of the amplifier. In operational amplifier design, it is desirable to provide a high gain from input to output while maintaining a negligible offset voltage. The offset voltage is the voltage difference between the inverting and non-inverting inputs.

The current source for an amplifier is typically designed to provide equal currents to both collectors of the emitter-coupled transistor pair. However, the load current flowing through the output transistor into the load impedance causes a base current to flow in the output transistor. This base current is drawn from the current to the collector of one of the emitter-coupled transistors. This causes an unbalance in the currents to the two emitter-coupled transistors and thereby creates an offset voltage which is a function of the load current.

SUMMARY OF THE INVENTION

The present invention is an improved active load which eliminates the current imbalance between the collectors of the emitter-coupled input transistors. The circuit includes a pair of first and second emitter-coupled transistors with their collectors coupled to a current source which supplies substantially equal currents to the collectors of the two transistors. The collector of one of the emitter-coupled transistors is coupled to the base of a third output transistor. A fourth transistor is coupled between the collector of the output transistor and the supply voltage. Finally, the circuit includes means for supplying the base current to the fourth transistor such that the base currents of the fourth transistor and the third output transistor are substantially equal and the collector currents of the first and second emitter-coupled transistors remain substantially equal.

Preferably, the base of the fourth transistor is coupled to the collector of the first emitter-coupled transistor while the base of the output transistor is coupled to the collector of the second emitter-coupled transistor. Because the same load current flows through the fourth transistor and the output transistor, provided that the transistors have identical characteristics, their base currents will be substantially identical. Thus, the current drawn from the collector of the second emitter-coupled transistor to the base of the output transistor will be matched by an equal current drawn from the collector of the first emitter-coupled transistor to the base of the fourth transistor.

Thus, the currents into the collectors of the two emitter-coupled transistors remain substantially identical regardless of the load current. This results in the offset voltage being very small. In addition, the impedance looking into the base of the output transistor from the input stage is very large because the balancing of the current has the same effect as no current flowing into the base of the output transistor. Thus, a very high gain is achieved. By using a Wilson current source to supply the current to the collectors of the emitter-coupled transistors, a very high impedance looking into the current source is achieved thereby enhancing the performance of the amplifier.

For a further understanding of the nature and advantages of the invention, reference should be made to the ensuing detailed description taken in conjunction with the accompanying drawings.

BRIEF DESCRIPTION OF THE DRAWINGS

FIG. 1 is a schematic diagram of a prior art amplifier with an active load.

FIG. 2 is a schematic diagram of one embodiment of the present invention.

FIG. 2A is a schematic diagram of an alternate configuration of the Wilson current source of FIG. 2.

FIG. 3 is a schematic diagram of a second preferred embodiment of the present invention.

FIG. 4 is a schematic diagram of a third preferred embodiment of the present invention.

FIG. 5 is a schematic diagram of a preferred embodiment of the present invention incorporated into a voltage-to-current converter.

DETAILED DESCRIPTION OF THE PREFERRED EMBODIMENTS

FIG. 1 shows a prior art amplifier with an active load connected as a voltage follower. The circuit has a pair of emitter-coupled transistors 10 and 12. The collector of transistor 12 is coupled to the base of an output transistor 14. Current is supplied to the collectors of emitter-coupled transistors 10, 12 by a pair of current source transistors 16, 18. A PNP buffer transistor 24 with its base coupled to the collector of transistor 10 and its collector coupled to ground provides the base current for the transistors 16, 18. A pair of current source transistors 20, 22 couple the emitter of output transistor 14 and the emitters of transistors 10, 12 to a negative voltage. An input voltage is applied to the base of transistor 10 for the non-inverting input and the output is the emitter of transistor 14. The output is connected back to an inverting input at the base of transistor 12 to provide a voltage follower configuration.

Current source transistors 16, 18 provide currents $I_1$ and $I_2$ to transistors 10 and 12, respectively. Ideally, to have zero offset voltage between the non-inverting and inverting inputs, $I_1$ and $I_2$ should be equal. However, when a load current $I_L$ flows through output transistor 14, the base current for transistor 14 is $I_L/\beta$. This base current draws current away from the collector of transistor 12, and causes an imbalance between currents $I_1$ and $I_2$. A current $I_3$ from the base of transistor 24 is very small and can be ignored for this discussion.

The offset voltage will be sensitive to the output load and is given by the following equation:

$$\text{offset voltage} = (V_t) \ln [(I_2 + I_L/\beta)/I_1]$$

$$(V_t) = \text{thermal voltage} = kt/q$$

where
  k = Boltzmann's constant
  q = the charge of an electron
  t = absolute temperature in degrees Kelvin It can thus be seen that the larger the load current $I_L$, the larger the offset voltage will be.

The open loop gain of the circuit of FIG. 1 is also dependent upon the load and is given by the following equation:

$$\text{open loop gain} = (gm)(\beta)(R_L)$$

where $(\beta)(R_L)$ = input impedance of the base of transistor 14 gm = transconductance of the input stage (transistors 10, 12).

Thus, both the offset voltage and the open loop gain are dependent upon the load current, thereby degrading the performance of the amplifier.

FIGS. 2–4 show different embodiments of the circuit of the present invention in a voltage follower configuration. FIG. 4 is the simplest embodiment using the least number of transistors. FIGS. 2 and 3 are embodiments which aid in the understanding of the operation of the circuit of FIG. 4.

In FIG. 2, the bases of a pair of emitter-coupled transistors 26, 28 form the non-inverting and inverting inputs, respectively, of a voltage follower amplifier. The collector of transistor 28 is coupled to the base of an output transistor 30. A Wilson current source 32 composed of PNP transistors 34, 36 and 38, supplied equal currents $I_1$ and $I_2$ to the collectors of transistors 26 and 28. A pair of current source transistors 40, 42 supply the current for the emitters of the emitter-coupled transistors 26, 28 and output transistor 30.

An additional transistor 44 is placed between output transistor 30 and positive supply voltage V+. The same load current $I_L$ flows through both of transistors 30 and 44. The bases of transistors 30 and 44 are supplied by two legs of a second Wilson current source 46 composed of transistors 48, 50 and 52. If transistors 30 and 44 have matching characteristics, the base current of each will be equal to $I_L/\beta$. Thus, equal currents will be drawn from the two legs of Wilson current source 46 by transistors 30, 44. Since the entire base current for transistor 30 is drawn from Wilson current source 46, no load current is drawn from the collector of transistor 28. This current, which is referred to as $I_3$ in the diagram, is equal to zero. Thus, there is no loading to unbalance current $I_2$ with respect to $I_1$ and the offset voltage is not affected by the output load. The value of the offset voltage is given by the following equation:

$$\text{offset voltage} = (kt/q) \ln (I_2/I_1)$$

Since $I_2$ equals $I_1$, the offset voltage is zero.

The open loop gain of the circuit of FIG. 2 is the transconductance of the input stage of transistors 26 and 28 times the impedance at node 54. From node 54 looking to the base of transistor 30, the impedance is effectively infinity because no current is ever drawn. The impedance looking into the collector of transistor 38 of Wilson current source 32 is very high due to the nature of the Wilson current source. Thus, an open loop gain which is 10 to 100 times larger than the open loop gain of the circuit of FIG. 1 is achieved.

The three transistor Wilson current source 32 of FIG. 2 can be constructed with two transistors as shown in FIG. 2A. A single transistor 56 takes the place of transistors 34, 36 of FIG. 2 and a transistor 58 corresponds to transistor 38 of FIG. 2. Because the emitters and bases of transistors 34 and 36 of FIG. 2 are tied together, the emitter and base can be shared and the single transistor 56 with two collectors can be used as shown in FIG. 2A. This configuration saves space in an integrated circuit.

FIG. 3 shows a circuit in which Wilson current sources 32 and 46 of FIG. 2 are essentially combined to provide a single Wilson current source 60 as shown in FIG. 3. Wilson current source 60 is composed of three PNP transistors 62, 64 and 66, respectively. Transistors 62 and 66 both have two collectors. A pair of emitter-coupled transistors 68, 70 are provided as well as an output transistor 72. Current source transistors 74, 76 provide the current to the emitters of transistors 68, 70 and 72. A transistor 78 is inserted between transistor 72 and the positive voltage supply to balance the base current drawn by transistor 72.

In operation, an equal load current $I_L$ flows through transistors 78 and 72, thereby causing an equal base current $I_L/\beta$ for each of the transistors. By adding a second collector to transistors 62 and 66 on the two legs of Wilson current source 60, and coupling these second collectors to the bases of transistors 78 and 72, respectively, an equal current is drawn from each side of Wilson current source 60. Thus, currents $I_1$ and $I_2$ to the collectors of transistors 68 and 70 are unaffected by the load. It can also be seen that there is no direct connection between the collector of transistor 70 and the base of output transistor 72, thereby resulting in a virtually infinite impedance looking from the collector of transistor 70 into the base of output transistor 72.

The circuit can be further simplified by coupling the bases of transistors 78 and 72 to the two legs of the output of the Wilson current source 60 rather than to second collectors. Transistors 62 and 64 of FIG. 3 are then combined in the manner shown in FIG. 2A to give a single two collector transistor. The design is thus simplified and the circuit of FIG. 4 results.

FIG. 4 shows a pair of emitter-coupled transistors 80, 82, with their bases providing the noninverting and inverting inputs, respectively. A Wilson current source 84 using the configuration of FIG. 2A provides currents $I_1$ and $I_2$ to the collectors of the emitter-coupled transistors 80, 82. Wilson current source 84 is composed of a two collector PNP transistor 86 and a PNP transistor 88. An output transistor 90 has its base coupled to the collector of transistor 82. Current source transistors 92 and 94 provide the current for the emitters of transistors 80, 82 and 90.

A transistor 96 is added to the circuit to balance currents $I_1$ and $I_2$ by drawing a base current equal to the base current of transistor 90. The offset voltage is thus virtually eliminated, thereby increasing the open loop gain. In operation, when a load $R_L$ is connected to the output ($V_{out}$), a load current $I_L$ will flow through transistor 90 causing a current $I_L/\beta$ to flow into the base of transistor 90. This current $I_L/\beta$ would normally reduce the current $I_2$ flowing into the collector of transistor 82, thereby causing an imbalance between currents $I_1$ and $I_2$. The addition of transistor 96 prevents this imbalance. The same load current $I_L$ flows through transistor 96, causing the same base current $I_L/\beta$ if transistor 96 has the same characteristics as transistor 90. By coupling the base of transistor 96 to one leg of Wilson current source 84 at note 98, with the other leg coupled to the base of output transistor 90 at node 100, currents $I_1$ and $I_2$ are balanced. The balancing of these currents is evident from comparing the current equations at nodes 98 and 100 as follows:

$$I_A = I_1 + I_L/\beta$$

$$I_B = I_2 + I_L/\beta$$

$I_A$ and $I_B$ are the equal currents produced in the two legs of Wilson current source 84. Since $I_A$ and $I_B$ are equal, $I_1$ and $I_2$ will be equal regardless of the value of the load current $I_L$. Thus, there will be negligible offset voltage between the non-inverting and inverting inputs at the bases of transistors 80 and 82. In addition, the open loop gain is equivalent to that of FIGS. 2 and 3. Since currents $I_1$ and $I_2$ will always be equal, it appears at node 100 as though there were no connection to the base of transistor 90 because the current at the base transistor 90 is supplied by Wilson current source 84 and an equal current is pulled from the collector of transistor 80.

The present invention can be used in other amplifier configurations. FIG. 5 shows a voltage-to-current converter utilizing the present invention. The circuit has a non-inverting and inverting input at the bases of emitter-coupled transistors 102 and 104, respectively. A Wilson current source 106 is also provided. An output transistor 108 is coupled to the collector of transistor 104 through an intervening stage. Another transistor 110 is provided to draw current from one leg of Wilson current source 106 thereby balancing an equal current drawn from the other leg by transistor 108.

The present invention has application in other amplifiers as well, particularly in buffer amplifiers which require negligible offset voltage and a high open loop gain. As will be understood by those familiar with the art, the present invention can be embodied in other forms without departing from the spirit or essential characteristics thereof. For example, a current source other than the Wilson current source could be used. Accordingly, the foregoing embodiments are intended to be illustrative of, but not limiting of, the scope of the invention which is set forth in the following claims.

I claim:

1. In an amplifier having a pair of first and second emitter-coupled transistors, each having a base, an emitter and a collector, a current source for providing substantially equal currents to each of two legs of said current source, a first leg being coupled to the collector of said first emitter-coupled transistor and a second leg being coupled to said second transistor, and a third output transistor having a base coupled to the collector of said second emitter-coupled transistor and a collector coupled to a supply voltage, the improvement comprising:
    a fourth transistor having a collector and an emitter coupled between said supply voltage and said third output transistor, a base of said fourth transistor being coupled to said first leg;
    so that current flowing through the bases of said third and fourth transistors are substantially equal and currents flowing through the collectors of said first and second transistors are substantially equal.

2. The amplifier of claim 1 wherein said current source is a Wilson current source comprising:
    fifth and sixth PNP transistors each having a base, an emitter and a collector, having their bases coupled together, having their emitters coupled to said supply voltage, the base of said fifth transistor being coupled to its collector and the collector of said sixth transistor being coupled to the collector of one of said emitter-coupled transistors; and
    a seventh PNP transistor having an emitter coupled to the collector of said fifth transistor, a base coupled to the collector of said sixth transistor and a collector coupled to the collector of the other one of said emitter-coupled transistors.

3. The amplifier of claim 2 wherein said sixth transistor is formed in an integrated circuit as a single transistor having two collectors, a first collector being coupled to said collector of said first transistor and a second collector being coupled to said base of said fourth transistor, and said seventh transistor is formed as a single transistor having two collectors, a first collector being coupled to said collector of said second transistor and a second collector being coupled to said base of said third transistor.

4. An amplifier comprising:
    a pair of first and second emitter-coupled transistors each having a base, an emitter and a collector;
    a current source for providing substantially equal currents to the collectors of said emitter-coupled transistors;
    a third output transistor having a base coupled to the collector of said second emitter-coupled transistors; and
    a fourth transistor coupled at a collector and an emitter between a supply voltage and a collector of said third output transistor, a base of said fourth transistor being coupled to said collector of said first emitter-coupled transistor;
    so that the currents flowing through the bases of said third and fourth transistors are substantially equal and the currents flowing through the collectors of said first and second transistors are substantially equal.

5. The amplifier of claim 4 wherein said current source is a Wilson current source comprising:
    fifth and sixth PNP transistors each having a base, an emitter and a collector, having their bases coupled together, having their emitters coupled to said supply voltage, the base of said fifth transistor being coupled to its collector and the collector of said sixth transistor being coupled to the collector of one of said emitter-coupled transistors; and
    a seventh PNP transistor having an emitter-coupled to the collector of said fifth transistor, a base coupled to the collector of said sixth transistor and a collector coupled to the collector of the other of said emitter-coupled transistors.

6. The amplifier of claim 4 wherein said current source comprises fifth and sixth PNP transistors, said fifth transistor being formed in an integrated circuit from a single transistor having two collectors, a first collector being coupled to said base of said fifth transistor, a second collector being coupled to said collector of said first transistor, said emitter of said fifth transistor being coupled to a supply voltage, said sixth transistor having an emitter coupled to said base of said fifth transistor, a base coupled to said collector of said first transistor and a collector coupled to said collector of said second transistor.

7. An amplifier comprising:
    a pair of first and second emitter-coupled transistors each having a base, an emitter and a collector;
    a current source for providing substantially equal currents to the collectors of said emitter-coupled transistors, said current source including a third PNP transistor having an emitter coupled to a supply voltage, a first collector coupled to its base and a second collector coupled to the collector of one of said emitter-coupled transistors and a fourth PNP transistor having an emitter coupled to a base of said third transistor, a base coupled to the second collector of said third transistor and a collector coupled to the collector of the other of said emitter-coupled transistors;

a fifth output transistor having a base coupled to the collector of said second transistor and an emitter coupled to an output; and a sixth transistor having a collector coupled to said supply voltage, an emitter coupled to the collector of said fifth output transistor and a base coupled to the collector of said first transistor.

8. The amplifier of claim 7 wherein the emitter of said fifth output transistor is coupled to the base of said second emitter-coupled transistor to form a voltage-follower amplifier.

* * * * *